United States Patent [19]
Kuo

[11] Patent Number: 5,874,745
[45] Date of Patent: Feb. 23, 1999

[54] THIN FILM TRANSISTOR WITH CARBONACEOUS GATE DIELECTRIC

[75] Inventor: Yue Kuo, Chappaqua, N.Y.

[73] Assignee: International Business Machines Corporation, Armonk, N.Y.

[21] Appl. No.: 906,492

[22] Filed: Aug. 5, 1997

[51] Int. Cl.[6] .................................................. H01L 29/78
[52] U.S. Cl. ........................... 257/59; 257/72; 257/324; 257/406; 257/410; 257/411
[58] Field of Search .................... 257/57, 59, 72, 257/228, 324, 347, 350, 377, 382, 406, 410, 411, 538

[56] References Cited

U.S. PATENT DOCUMENTS

| | | | |
|---|---|---|---|
| 4,849,797 | 7/1989 | Ukai et al. | 257/57 |
| 4,956,680 | 9/1990 | Tanaka et al. | 357/4 |
| 4,994,401 | 2/1991 | Ukai | 437/40 |
| 5,101,288 | 3/1992 | Ohta et al. | 359/54 |
| 5,210,045 | 5/1993 | Possin et al. | 437/42 |
| 5,250,451 | 10/1993 | Chouan | 437/40 |
| 5,326,746 | 7/1994 | Ohtani et al. | 505/330 |
| 5,614,731 | 3/1997 | Uchikoga et al. | 257/59 |
| 5,710,606 | 1/1998 | Nakajima et al. | 257/59 |
| 5,719,422 | 2/1998 | Burr et al. | 257/404 |

FOREIGN PATENT DOCUMENTS

| | | |
|---|---|---|
| 4-204717 | 7/1992 | Japan . |
| 8-95505 | 4/1996 | Japan . |

*Primary Examiner*—Tom Thomas
*Assistant Examiner*—Fetsum Abraham
*Attorney, Agent, or Firm*—Jay P. Sbrollini; Anne Vachon Dougherty

[57] ABSTRACT

A gate dielectric layer comprising a carbon film aligned to, and continuously covering, the gate electrode. The carbon dielectric film adheres to a wide variety of gate metals and is readily etched using etch processes which do not etch into the gate metal. In a preferred embodiment, the self-aligned carbon gate dielectric is deposited by plasma deposition, followed by deposition of a redundant gate dielectric.

8 Claims, 3 Drawing Sheets

THIN FILM TRANSISTOR WITH CARBONACEOUS GATE DIELECTRIC

FIELD OF THE INVENTION

This invention relates to semiconductor transistor structures and more particularly to thin film transistors for use in liquid crystal display products.

BACKGROUND OF THE INVENTION

Amorphous silicon (a-Si:H) thin film transistors (TFTs) are critical devices for high performance liquid crystal display (LCD) products. TFTs can also be applied to other two-dimensional imagers, sensors, and electronic equipment. Therefore, TFT development is a fundamental technology for present and future electronics. Currently, a serious problem for the production of a-Si:H TFTs is low yield due to shorts between conducting layers, specifically between the gate metal and the source/drain metals, as detailed below with reference to FIG. 1. Due to the requirement that each layer be as thin as possible, poor step coverage of dielectric layers over the metal steps can cause discontinuities of the metal layers or shorts between top and bottom metals. This results in unworkable products.

A common profile for a-Si:H TFTs is the inverted, staggered structure illustrated in FIG. 1. A metal gate 11 is formed on a substrate 10 which is a glass or silicon wafer, and coated with a thin layer of gate dielectric 12. Over the gate dielectric, an active amorphous silicon layer 16 and a dielectric layer 15 are deposited, followed by patterning the dielectric layer 15, and depositing and patterning source and drain metal, 13 and 14. A thin n+ layer (not shown in this figure) is usually deposited before deposition of the source and drain metal. Variations on the illustrated TFT include multichannel TFTs, of the type described in the article entitled "Single-gate multichannel amorphous silicon thin-film transistors," authored by the present inventor, *Applied Physics Letters,* Vol. 67, No. 21, pages 3174–3176, (November 1995), and split-gate TFTs, of the type described in "Horizontally Redundant, Split-Gate a-Si:H Thin Film Transistors," authored by the present inventor, *Journal of the Electrochemical Society,* Vol. 143, No. 8, pages 2680–2682, (August 1996). All of the known TFTs are prone to experiencing metal-to-metal shorts occurring between the gate and the source and/or drain regions, because the gate dielectric step coverage to the metal line is poor, or because the gate dielectric film at the bottom corner of the gate line is easily attacked by etchants during subsequent processing.

Prior art solutions which have been proposed to overcome the problems associated with shorts between the metal of the transistor gate and source/drain regions include providing redundant gate dielectric layers to improve gate metal coverage. In providing redundant gate dielectric layers, it is common to utilize two different gate dielectric materials, thereby decreasing the likelihood of duplicating or propagating any pinholes or weak areas in the first-deposited layer. Combinations of gate dielectric layers which have been taught in the literature include $SiN_x/SiO_2$, $SiN_x/Ta_2O_5$, and $SiN_x/Al_2O_3$. In each instance, the $SiN_x$ layer is preferably deposited adjacent to the a-Si:H layer, due to the low interface density of states encountered between the two materials. If $SiO_2$ is used, the gate dielectric is necessarily blanket-deposited on the substrate and gate structure. As a result, the gate dielectric is not self-aligned to the gate metal. For LCD applications, if the ITO is deposited before the preparation of the TFT, the $SiO_2$ layer must be etched off with the gate $SiN_x$ layer to make contact vias, which adds an extra processing step. An additional disadvantage to usage of $SiO_2$ is that it is etchable by the hydrofluoric acid solution which is required to etch the subsequently-deposited $SiN_x$. What occurs, therefore, is unintended etching of the redundant layer leaving discontinuities in the $SiO_2$ layer which may result in the metal-to-metal shorts that the layer was supposed to prevent.

Both of the known redundant metal oxide gate dielectric materials, $Ta_2O_5$ and $Al_2O_3$, are deposited in a manner to provide a self-aligned gate dielectric immediately adjacent the gate metal. In addition, each of the alternative materials exhibits greater etch resistance to hydrofluoric acid than does $SiO_2$. However, anodization is required to grow the self-aligned metal oxides on the gates. Anodization is carried out in aqueous solutions, thereby introducing a significant source of contaminants such as sodium and potassium which can become trapped in the porous metal oxide film. In addition, the metal oxide layers are difficult to etch with either a wet or a dry process, and etching of the metal oxide layers is necessary in the via areas for connecting the driving integrated circuits to the gate and to the data lines.

It is also to be noted that $Ta_2O_5$ requires that the gate metal includes tantalum which has a high resistivity and is therefore generally considered unsuitable for use as a gate material for large area applications. Similarly, $Al_2O_3$ requires that the gate metal include aluminum. While an aluminum or aluminum alloy gate would have favorable electrical properties, it is not preferred due to the aforementioned shortcomings of porosity and ready contamination.

It is therefore an objective of the present invention to provide a thin film transistor structure having a self-aligned dielectric layer which has minimal contaminations and provides nonporous gate coverage.

It is additionally an objective of the present invention to provide a gate dielectric which is easily deposited and etched with minimal impact on the adjacent materials.

SUMMARY OF THE INVENTION

These and other objectives are realized by the present invention comprising a self-aligned gate dielectric layer comprising a carbon film deposited using a plasma process. The carbon film preferably adheres in a self-aligned manner to a wide variety of gate metals and is readily etched using etch processes which do not etch into the gate metal.

BRIEF DESCRIPTION OF THE DRAWINGS

The invention will now be described in detail with specific reference to the appended drawings wherein.

DESCRIPTION OF THE PREFERRED EMBODIMENT

Figure 1:
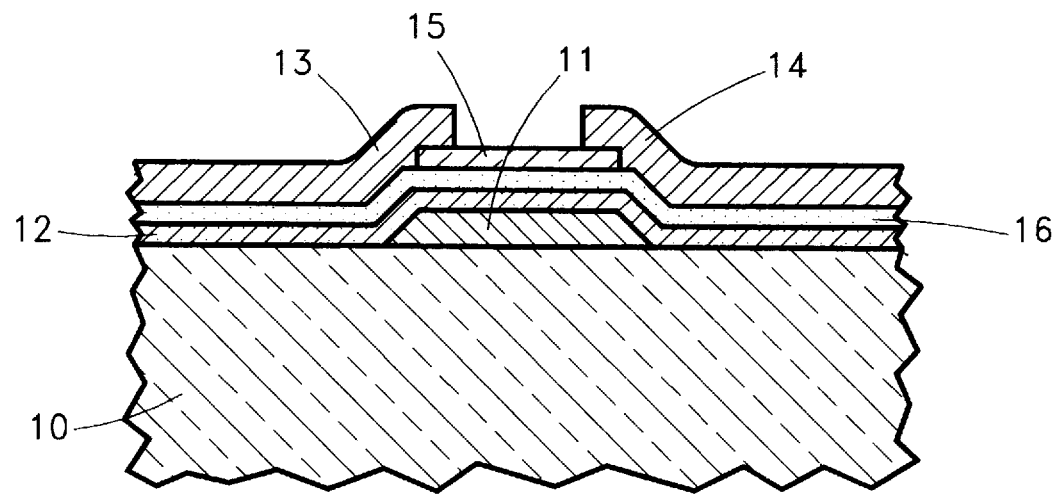
FIG. 1 illustrates a prior art inverted transistor structure.
Figure 2:
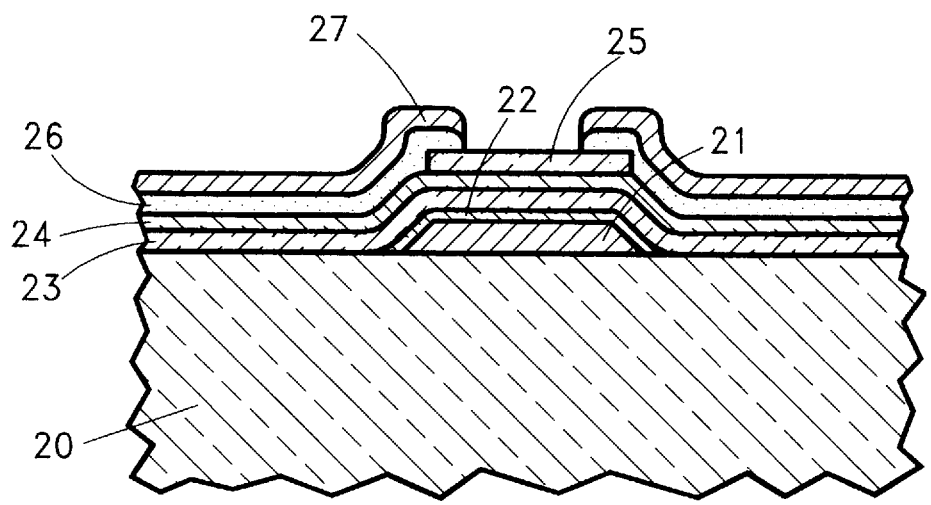
FIG. 2 provides an illustration of an amorphous silicon thin film transistor in accordance with the present invention.

The inventive structure, as depicted in FIG. 2, comprises a thin film transistor formed on a glass substrate, 20. The thin film transistor includes metal gate 21, comprised of chromium, molybdenum, aluminum, tantalum, titanium, etc., having a gate dielectric deposited thereon. The gate dielectric comprises a first-deposited carbon dielectric layer 22 followed by a second dielectric layer, 23. The carbon dielectric layer 22 preferably comprises pure carbon, but may comprise carbon and small amounts of other material such as Si and O and/or N. Moreover, the carbon dielectric layer 22 preferably is a continuous film that lacks pinholes (or has a minimum number of pinholes) and that lacks discontinuous areas on the edge of the film (such as a crack) In addition, the carbon dielectric layer 22 is preferably self-aligned in that it grows only on the surface of the gate line (not on the glass or other dielectric surface).

In the alternative, the carbon dielectric layer 22 may be deposited on the metal gate 21 and portions of the substrate not covered by the metal gate 21. In this case, the carbon dielectric layer may be etched with a pattern that aligns the carbon dielectric layer 22 to the metal gate 21.

The second dielectric layer 23 preferably comprises $SiN_x$ (or $SiO_2$) and covers both the carbon dielectric layer 22 and the exposed surface of the substrate surrounding the gate and gate dielectric structure.

On the $SiN_x$ layer is deposited the rest of the a-Si:H TFT structure, comprising representatively a first conformal active layer, 24, of amorphous silicon or polysilicon, a layer, 25, of $SiN_x$ or $SiO_2$ deposited on the active layer and patterned to remain over the gate area, a conformal layer, 26, of $n^+$-doped silicon covering the $SiN_x$ feature and the exposed regions of the amorphous silicon, and conformally-deposited top metal, 27, overlaying the $n^+$-doped silicon layer. The $n^+$-doped silicon 26 and top metal 27 are etched down to the surface of the $SiN_x$ feature 25, as well as to the $SiN_x$ layer 23 (in areas not shown), to thereby form the source and drain regions on either side of the opening. As will be recognized by one having skill in the art, the inventive method and structure can be implemented in a myriad of transistor profiles. The inventor does not wish to be limited to the use of the carbonaceous gate dielectric only in the illustrated tri-layer TFT structure, as such can be incorporated into not only tri-layer TFTs, but bi-layer TFTs and other inverted transistor structures as well.

Figure 3A:
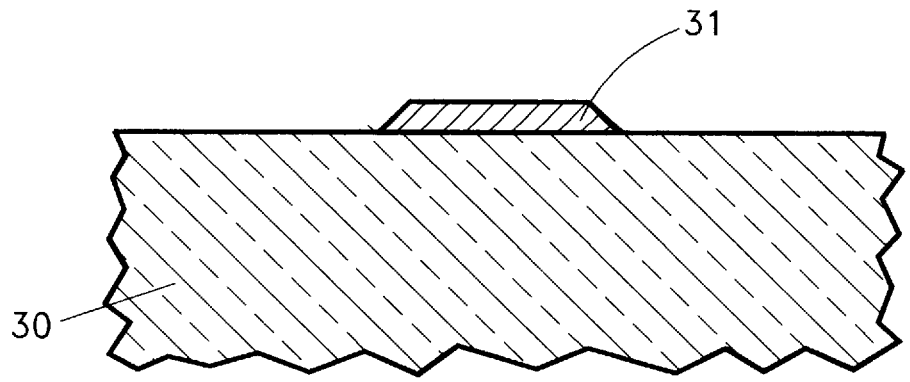
FIGS. 3A through 3F illustrate processing steps for fabricating an amorphous silicon thin film transistor in accordance with the present invention.

FIGS. 3A through 3F illustrate the inventive process flow for producing the inventive tri-layer TFT structure. As depicted in FIG. 3A, a metal gate 31 is formed on the dielectric substrate 30. The gate metal may be, for example, 1000Å of molybdenum deposited in a blanket layer over a glass substrate and then etched to form the gate structure.

Figure 3B:
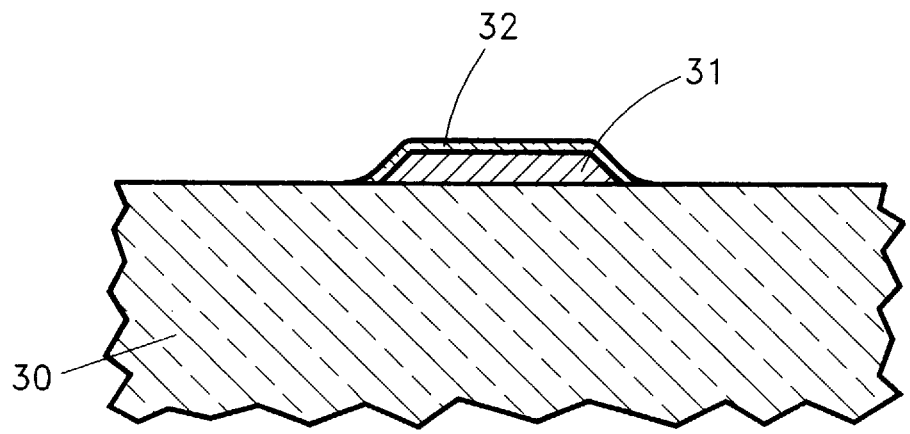

Next the self-aligned, continuous layer of pure carbon is deposited over the gate structure, as illustrated at 32 in Figure 3B. Preferably, the carbon layer 22 is a continuous film deposited over the gate metal by plasma deposition. More specifically, in a plasma reactor, carbonaceous organic gas (e.g., $CH_4$ or $C_2H_6$) is introduced under conditions which result in pure carbon being deposited on the metal and not on the surrounding exposed dielectric substrate. The process window, with regard to such variables as power, pressure and temperature, is quite wide. An example of preferred plasma deposition conditions includes 50 sccm of $CH_4$, introduced at a pressure of 100m Torr, with the power set at 300w, and a deposition temperature at 250° C. It is to be noted that other gases, such as $H_2$ or He, can be added into the plasma to modify the film characteristics, to control the large-area uniformity, and/or to improve the selectivity. The reactor may be a parallel plate reactor, with the substrate loaded on the 13.5 MHz rf driven electrode. Under the example conditions, a 1000Å layer of pinhole-free carbon will be selectively deposited in a self-aligned manner over the gate metal. Given the fact that the plasma carbon deposition is conducted in a vacuum, the likelihood of contaminants is minimized. Since the deposition rate can be slow, the resulting film will have minimal pinhole density.

In the alternative, the carbon dielectric layer 22 may be formed by depositing a carbon layer on the metal gate 21 and portions of the substrate not covered by the metal gate 21. In this case, the carbon dielectric layer may be etched with a pattern which aligns the carbon dielectric layer 22 with the metal gate 21.

During subsequent etching steps (not shown), there is a high degree of etch selectivity between the carbon gate dielectric and the underlying metal. The carbon film can be readily etched with a plasma containing $O_2$, which would under the appropriate process conditions, etch the carbon without significantly impacting the underlying metal. When a proper amount of fluorine-containing gas, such as $CF_4$, or $SF_6$, is used, the carbon etch rate can be enhanced while the gate metal etch rate is very slow.

Figure 3C:
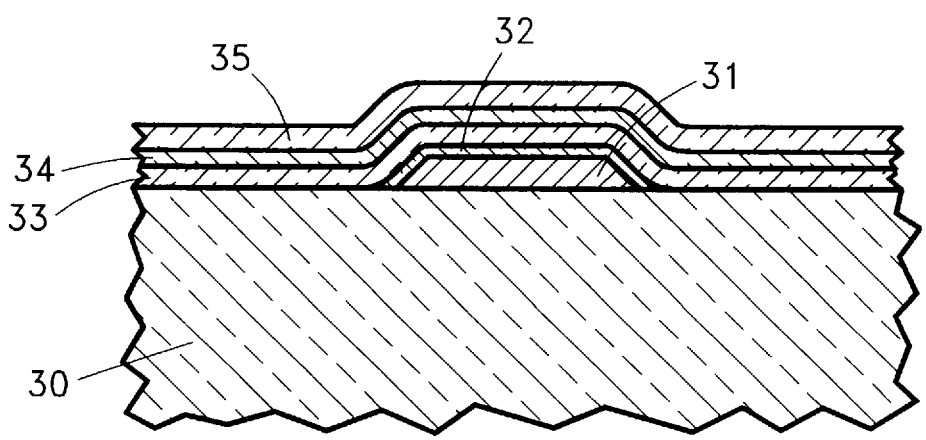
Figure 3D:
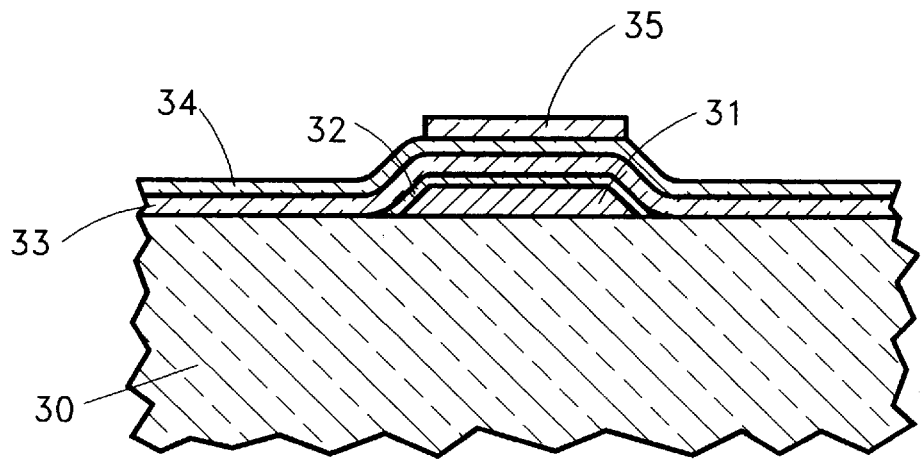
Figure 3E:
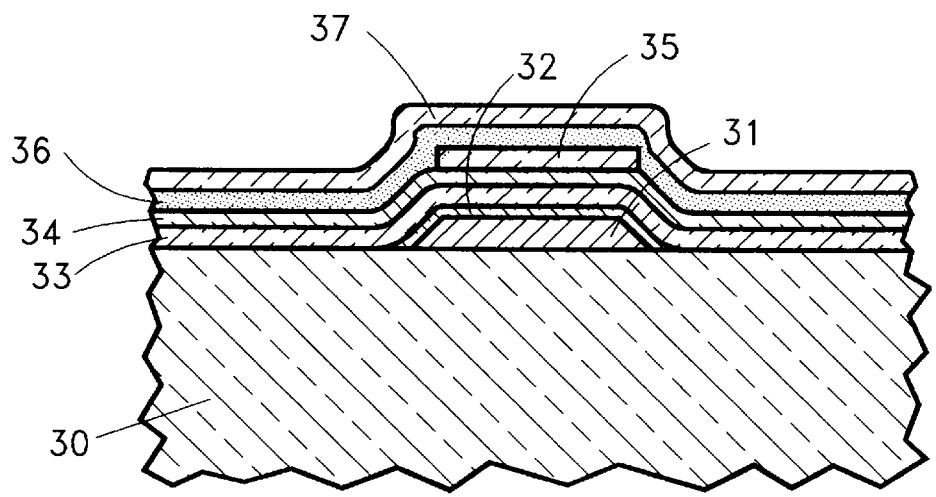
Figure 3F:
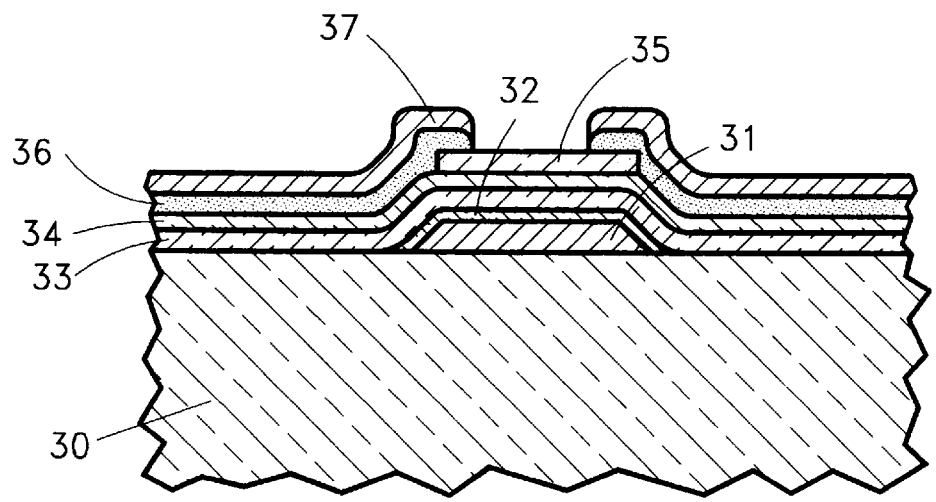

Subsequent to deposition of the carbon gate dielectric, the $SiN_x$/a-Si:H/$SiN_x$ layers, 33, 34 and 35, are deposited, at representative thicknesses of 2000Å/500Å/2000Å, in accordance with prior art techniques, such as in a PECVD reactor at 250° C., to provide the structure of FIG. 3C. Next, the top layer, 35, of $SiN_x$ is etched, for example with a buffered hydrofluoric acid solution using a backlight lithography method of the type described in the prior art, to form the patterned $SiN_x$ feature. The $n^+$ silicon layer is deposited, at 36, followed by top metal deposition, at 37 of FIG. 3E. Finally, as shown in FIG. 3F, the source and drain regions are defined by patterning layers 36 and 37 through a mask. To complete the TFT array for LCD applications, extra layers and patterning steps (not shown), such as ITO pixel formation and contact via pattern etching, would be conducted in accordance with prior art techniques.

The invention has been described with reference to several specific embodiments. One having skill in the relevant art will recognize that modifications may be made without departing from the spirit and scope of the invention as set forth in the claims.

Having thus described my invention, what I claim as new and desire to secure by Letters Patent is:

1. A gate structure for a semiconductor transistor formed on an insulating substrate comprising:

a gate electrode formed on a first portion of the surface of said insulating substrate, the remaining portion of the surface of said insulating substrate being exposed; and a redundant gate dielectric structure comprising a self-aligned continuous carbon film disposed on said gate electrode and an insulating film disposed on said self-aligned continuous carbon film and the exposed portion of the surface of said insulating substrate.

2. A thin film transistor structure comprising:

an insulating substrate;

a gate electrode formed on a first portion of the surface of said insulating substrate, the remaining portion of the surface of said insulating substrate being exposed;

a redundant gate dielectric structure comprising a self-aligned continuous carbon film disposed on said gate electrode and a first insulating film conformally deposited on said self-aligned continuous carbon film and the exposed portion of the surface of said insulating substrate;

a semiconductor layer deposited on said first insulating film; and a patterned metal layer deposited on said semiconductor layer and forming source and drain electrodes with an exposed region of said semiconductor layer located in the pattern opening between said source and drain electrodes.

3. The transistor of claim 2 wherein said semiconductor layer comprises amorphous silicon.

4. The transistor of claim 2 wherein said semiconductor layer comprises polysilicon.

5. The transistor of claim 2 wherein said first insulating film comprises $SiN_x$.

6. The transistor of claim 2 wherein said patterned metal layer comprises a first layer of n+ doped silicon and a second metal layer overlying said first n+ layer.

7. An inverted transistor structure comprising:

an insulating substrate;

a gate electrode formed on a first portion of the surface of said insulating substrate, the remaining portion of the surface of said insulating substrate being exposed;

a redundant gate dielectric structure comprising a self-aligned continuous carbon film disposed on said gate electrode and a first insulating film conformally deposited on said self-aligned continuous carbon film and the exposed portion of the surface of said insulating substrate;

a semiconductor layer deposited on said first insulating film;

a second insulating film deposited on said semiconductor layer in the region above said gate electrode; and a patterned metal layer deposited on said semiconductor layer and said second insulating film and forming source and drain electrodes with an exposed region of said second insulating film located in the pattern opening between said source and drain electrodes.

8. The transistor of claim 7 wherein said patterned metal layer comprises a first layer of n+ doped silicon and a second metal layer overlying said first n+ layer.

* * * * *